US006570398B2

(12) United States Patent
Murphy et al.

(10) Patent No.: US 6,570,398 B2
(45) Date of Patent: May 27, 2003

(54) SOCKET APPARATUS PARTICULARLY ADAPTED FOR LGA TYPE SEMICONDUCTOR DEVICES

(75) Inventors: Raymond F. Murphy, Attleboro, MA (US); Scott A. Leavitt, North Kingstown, RI (US); James A. Forster, Barrington, RI (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/961,659

(22) Filed: Sep. 24, 2001

(65) Prior Publication Data

US 2003/0057980 A1 Mar. 27, 2003

(51) Int. Cl.[7] ............................................... G01R 31/26
(52) U.S. Cl. ........................ 324/755; 324/158.1; 439/71
(58) Field of Search ............................. 324/158.1, 754, 324/755, 757, 758, 761, 765; 439/70, 71, 387, 69

(56) References Cited

U.S. PATENT DOCUMENTS 5,055,777 A * 10/1991 Bonelli et al. ............... 324/754
5,926,027 A * 7/1999 Bumb et al. ................. 324/755
6,208,155 B1 * 3/2001 Barabi et al. ................ 324/754
6,229,320 B1 * 5/2001 Haseyama et al. .......... 324/754

OTHER PUBLICATIONS

Page 8 of Catalog Published By DE–STA–CO (A Dover Resources Company).

* cited by examiner

*Primary Examiner*—Kamand Cuneo
*Assistant Examiner*—Jimmy Nguyen
(74) *Attorney, Agent, or Firm*—Russell E. Baumann; Frederick J. Telecky, Jr.

(57) ABSTRACT

A socket (10) has a cover (14) pivotably mounted to a base (12). The base is formed with a seat (12a) for mounting a semiconductor device on a contact mounting plate (18). A locking mechanism (20) for locking the cover in the closed position includes an over center linkage mechanism interacting with a locking pin (20a). In a modified embodiment, the locking mechanism is provided with a pivotable locking member (27) to provide either manual or automated operation. The cover (14) of socket (10) also comprises an integrally formed heat sink. In another embodiment (10'), a separate heat sink (30) is independently mounted on the cover (28) provided with an aperture through the cover in which the heat sink is slidably mounted.

13 Claims, 14 Drawing Sheets

SOCKET APPARATUS PARTICULARLY ADAPTED FOR LGA TYPE SEMICONDUCTOR DEVICES

RELATED APPLICATIONS

This application contains subject matter also disclosed in copending, coassigned application Ser. No. 09/961,658 filed of even date herewith.

FIELD OF THE INVENTION

This invention relates generally to a socket used in conducting electrical tests of semiconductor (SC) devices and more particularly to a socket for removably receiving a semiconductor device, such as an integrated circuit, and making electrical contact between the contacts of the device and respective contacts or terminals of the socket which in turn are connected to respective contact pads of a circuit substrate.

BACKGROUND OF THE INVENTION

It is conventional to place a semiconductor device in a socket which, in turn, is connected to a circuit substrate and then to place the substrate into an oven so that the temperature and voltage of the semiconductor device can be raised to a selected level to conduct a stress test, called a burn-in test, to determine whether the semiconductor device meets the required manufacturing specifications.

Typically, prior art sockets used for this purpose comprise a base member formed of electrically insulative material in which an electrical contact element is mounted for each contact of the semiconductor device to be tested. The contact elements are arranged in a selected pattern relative to the semiconductor device mounting seat provided in the base and have contact portions adapted to be placed in electrical engagement with respective contacts of the semiconductor device. In one type of prior art socket the semiconductor device to be tested is placed in the semiconductor device receiving seat and a cover member, pivotably mounted to the base, is held in a closed position by means of a spring biased latch, a clip, a nubbin on an actuation arm or base, a protrusion or the like. The cover places a bias on the semiconductor device to provide a selected contact force between the device leads and the contact elements of the socket. When a semiconductor device is loaded into the socket for testing it is critical that the cover be maintained in the closed position for the duration of the test procedure, however, in typical prior art structures either the cover locking mechanism is cumbersome and time consuming to apply, such as a clip, or it is subject to accidental dislodgement with consequent unintended and untimely opening. Another problem associated with this type of socket having a pivotably mounted cover relates to the angled application of force to the semiconductor device sometimes causing damage to the semiconductor device. That is, due to the pivoting movement of the cover, typically the upper inside edge of the semiconductor device closest to the pivotable connection of the cover to the base is the first portion of the device to engage the cover and it receives a force the direction of which changes as the cover is pivoted until the bottom surface of the cover comes into a parallel position with the top surface of the semiconductor device. This angled force, i.e., force which is not normal to the top of the SC, can damage the SC device.

SUMMARY OF THE INVENTION

It is an object of the present invention to provide a socket which overcomes the above noted limitations of the prior art.

Another object of the invention is to provide a socket having a pivotably mounted cover which has a locking mechanism for maintaining the cover in the closed position which is simply and quickly locked and unlocked and yet which is not subject to accidental or unintended unlocking. Another object of the invention is the provision of a socket having a pivotably mounted cover which avoids damaging semiconductor devices loaded therein. It is a further object of the invention to provide a socket which is highly reliable in operation and economical to manufacture.

Briefly, a socket made in accordance with a first embodiment of the invention comprises a cover pivotably mounted to a base to enclose a semiconductor device removably received for testing purposes. A locking mechanism for maintaining the cover in the closed position during the testing procedure includes a locking pin extending laterally from the base which interacts with an over center linkage mechanism. The linkage mechanism includes a first handle link pivotably mounted on the cover, providing a first axis immovable relative to the cover, a second locking link rotatably mounted to the cover having a locking pin receiving catch at one end thereof and having another end pivotably connected to an end of a third interconnecting link providing a second axis movable relative to the cover and with another end of the third link pivotably connected to the first link providing a third axis movable relative to the cover. When the cover is pivoted toward the closed position with the handle of the first link extending away from the cover, the first link is pivoted toward the cover bringing the locking pin receiving catch into engagement with the locking pin and the end of the cover frame into engagement with the locking pin bar and continued pivotal motion results in the third movable axis moving with snap action from one side of an imaginary line extending between the first and second axes to the other side thereof to thereby securely lock the cover in the closed position. Over center movement is limited by engagement of the second locking link with the first handle link. In a modified embodiment, the locking pin is attached to the second locking link and a locking catch member is pivotably mounted on the base for interaction with the locking pin. In this embodiment the cover can be opened either by raising (pivoting) the first handle link for manual operation or by applying a force to the pivotably mounted locking catch member.

In one embodiment the cover is integrally formed with a heat sink while in another embodiment a separately formed heat sink is independently mounted on the cover for sliding movement through a heat sink receiving aperture formed in the cover. According to a feature of the latter embodiment, the heat sink is preferably mounted on the cover with a first spring connection adjacent the hinged end of the cover and with second and third spring connections on the opposite end of the cover to ameliorate an even application of force to a semiconductor device disposed in the semiconductor receiving seat of the base. According to another feature of an embodiment of the invention, a boss having an outer configuration generally matching but preferably slightly less than that of a die of a semiconductor device to be received in the socket extends downwardly from the heat sink for engagement with a semiconductor device received in the socket. According to yet another feature, one or more pressure bars are slidably mounted for flexible movement in a pair of slots in the bottom surface of the cover for engaging the outer portions of the semiconductor device received in the socket.

In a modified embodiment the bottom surface of the heat sink is provided with a recessed portion for use with semiconductor devices having packaging features which extend above the die portion(s) and/or to move the initial engagement of the heat sink with the semiconductor device to a location slightly inboard of the outer periphery of the SC die.

BRIEF DESCRIPTION OF THE DRAWINGS

Other objects, advantages and details of the socket of the invention appear in the following detailed description of preferred embodiments of the invention, the detailed description referring to the drawings in which common reference characters are used to designate the same parts throughout the drawings and in which.

DETAILED DESCRIPTION OF THE PREFERRED EMBODIMENTS

Figure 1:
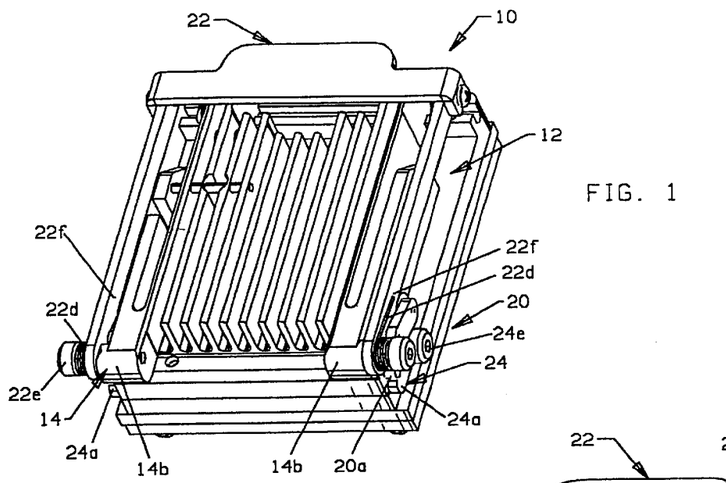
FIG. 1 is a perspective view of a socket made in accordance with a first embodiment of the invention in the closed position.
Figure 2:
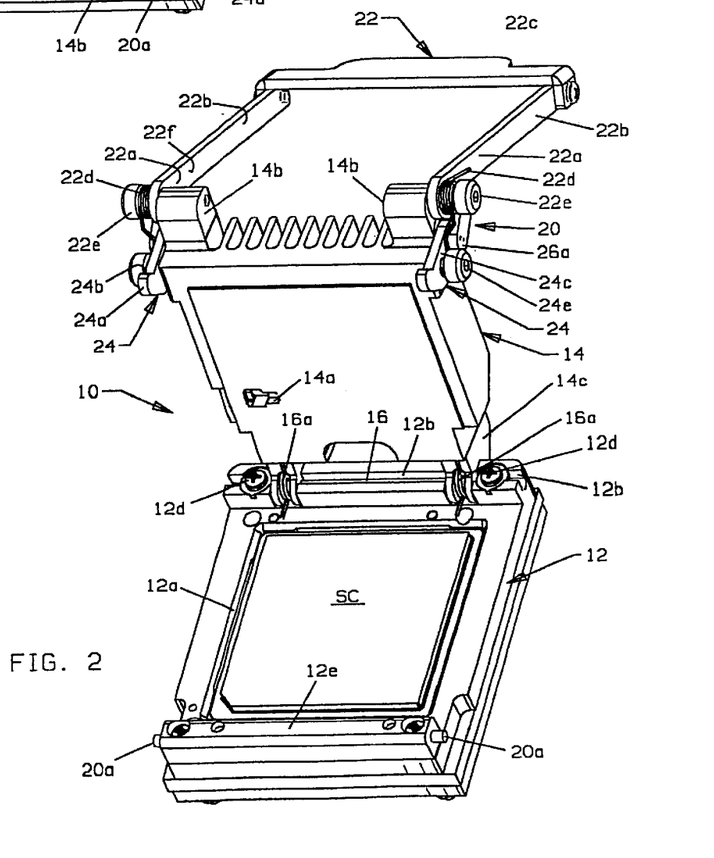
FIG. 2 is a perspective view of the FIG. 1 socket in the opened position.
Figure 3:
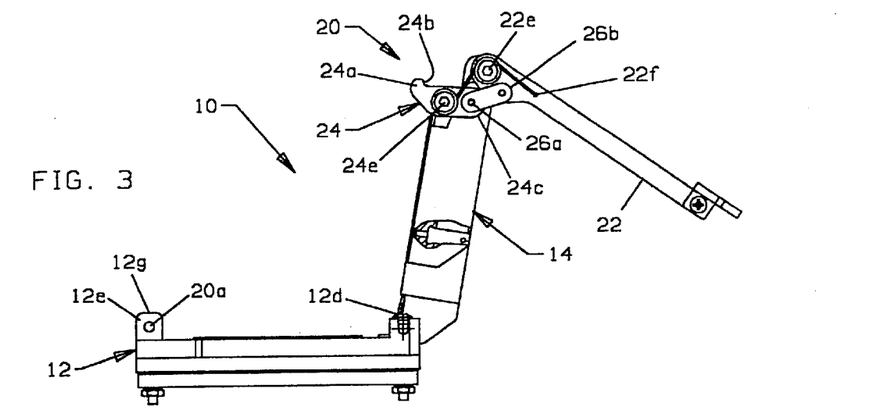
FIG. 3 is a side elevational view, partly broken away, of the FIG. 2 (opened position) socket.
Figure 4:
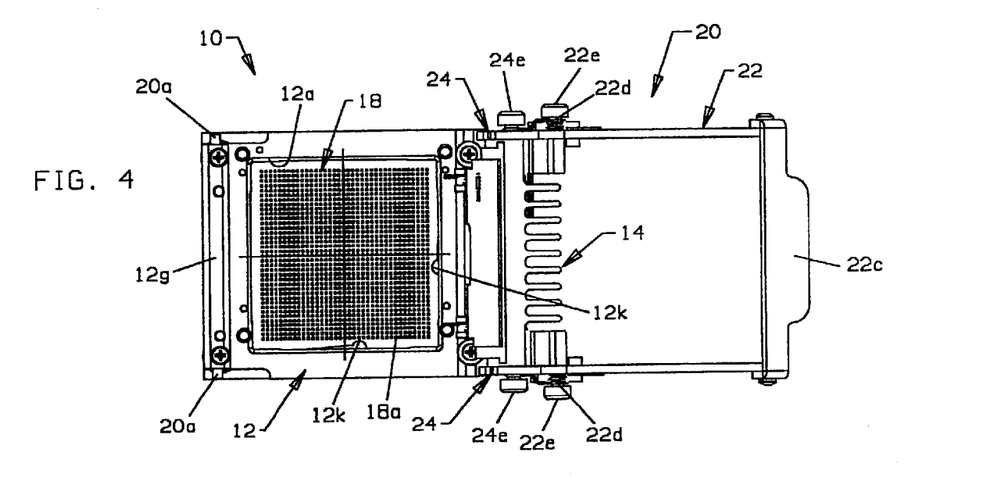
FIG. 4 is a top view of the FIG. 2 socket.
Figure 5:
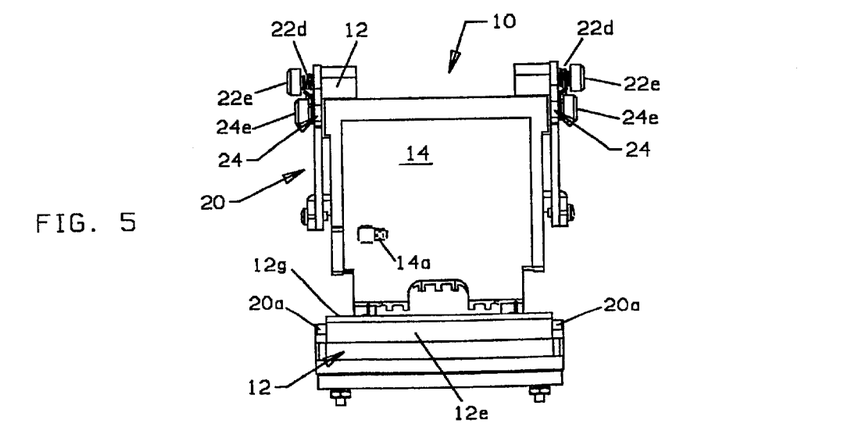
FIG. 5 is a front elevational view of the FIG. 2 socket.
Figure 6:
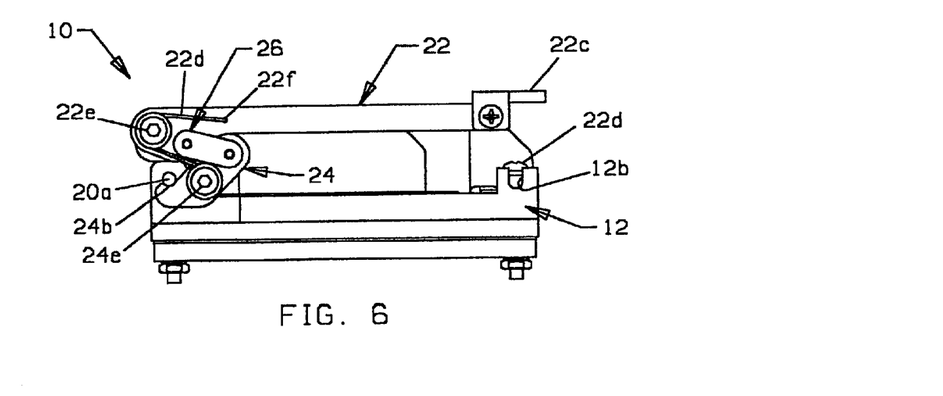
FIG. 6 is a side elevational view of the FIG. 1 (closed position) socket.
Figure 7:
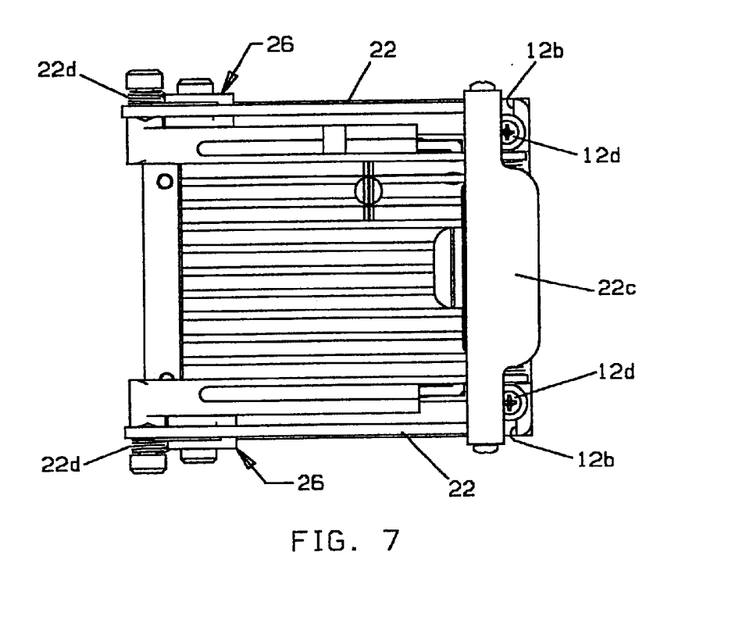
FIG. 7 is a top view of the FIG. 6 socket.
Figure 8:
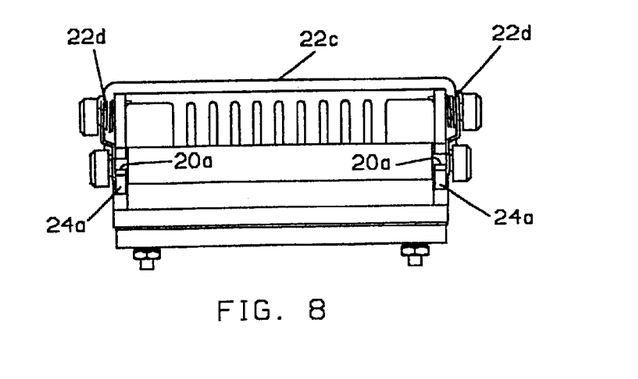
FIG. 8 is a front elevational view of the FIG. 6 socket.

A first preferred embodiment of the invention will be described with reference to FIGS. 1–9. Socket 10 made in accordance with the invention comprises a base 12 with an integral cover and heat sink 14 pivotably mounted at a first end to the base through shaft 16 (FIG. 2) disposed in slot 12b and locked therein by a suitable retainer such as washers 12f retained by the head of screws 12d. Base 12 is formed with a semiconductor device seat 12a exposing a contact mounting plate 18 having a selected array of contacts 18a (FIG. 4). Seat 12a is configured to be complimentary in shape with a selected semiconductor device SC (FIG. 2) so that device SC to be tested received in seat 12a will have its contacts on its lower surface (not shown) aligned and in engagement with respective contacts 18a. Spring members 12k (FIG. 4) can be provided to bias a device SC received in seat 12a toward a known reference location. A temperature sensor, such as a thermocouple or the like, may be mounted in an aperture 14a of cover 14, if desired, to monitor the temperature of the semiconductor device during the test procedure.

Socket 10 includes a locking mechanism 20 having a first portion of a locking member in the form of a locking pin 20a extending laterally outwardly from each side of a locking bar 12e mounted on base 12 at the second end thereof opposite to the first end and essentially serving as part of the base and a linkage mechanism preferably provided on each side of cover 14 at the second end comprising a handle or first link 22 which is generally U-shaped with the free distal ends 22a serving as a first end of link 22. Ends 22a are pivotably connected to cover 14 by screws 22e at opposite sides thereof at hubs 14b forming a first axis 1 (see FIG. 9) which is immovable relative to cover 14. The second ends 22b of the first link are interconnected by handle or bight portion 22c. The second ends 22b are movable toward and away from cover 14 between closed and opened positions, respectively and are biased toward the opened position by a suitable spring 22d received on screws 22e and having an end received in hole 22f of first link 22 and another end (not shown) trained around screw 24e.

Figure 9:
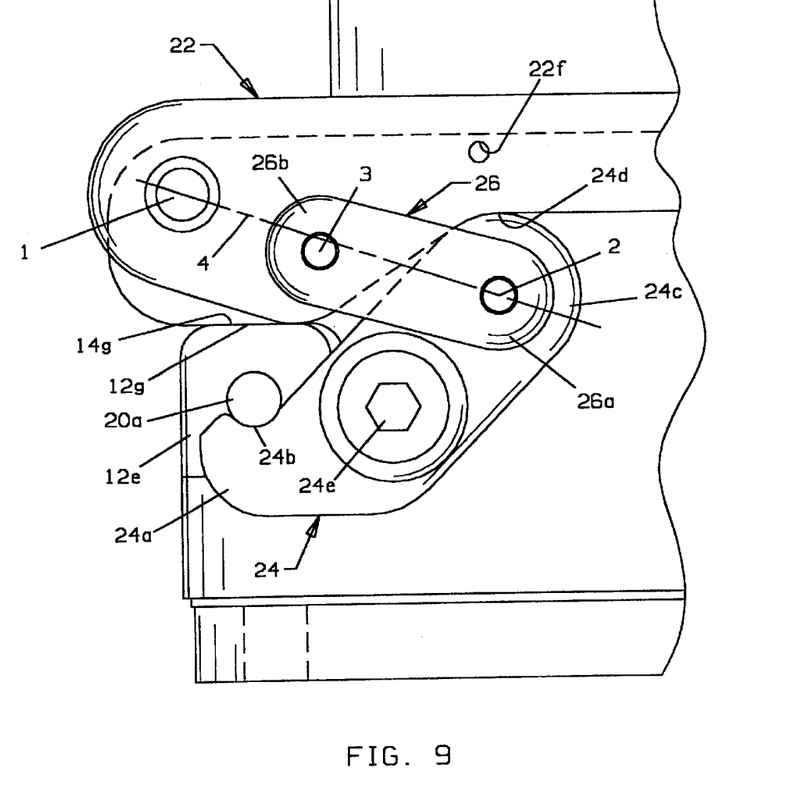
FIG. 9 is an enlarged, simplified portion of the FIG. 6 socket showing the linkage mechanism used in locking the socket in the closed position.

A locking or second link 24 is rotatably mounted at screw 24e to each side of cover 14 at a point intermediate to first and second ends with the first end 24a having a second portion of a locking member in the form of a locking pin receiving catch 24b.

An interconnecting or third link 26 for each linkage side having first and second ends 26a, 26b, respectively, has its first end 26a pivotably connected to the second end 24c of second locking link 24 forming a second axis 2 (FIG. 9) movable relative to cover 14 and its second end 26b pivotably connected to the first handle link at a third axis 3 (FIG. 9) movable relative to cover 14. With particular reference to FIG. 9, the third axis 3 is disposed in a position on one side of an imaginary line 4 drawn between axes 1 and 2 when the handle or second end of link 22 is in a position away from the cover maintaining the locking pin receiving catch 24b out of alignment with the locking pin 20a. The locking mechanism is actuated by pivoting cover 14 toward the closed position while maintaining the second end of link 22 in a position away from the cover thereby allowing the locking pin receiving catch to pass by locking pin 20a. The second end of link 22 is then pivoted toward the cover and the locking pin receiving catch comes into engagement with locking pin 20a and surface 14g of cover 14 engages surface 12g of locking bar 12e and with the third axis 3 snapping over to the other side of imaginary line 4. It should be noted that in order for the over center position of axis 3 to be stable, the distance between the surface of the catch which engages the locking pin 20a and surface 14g of the cover which engages top surface 12g is less than the bottom of locking pin 20a and the top surface 12g of the locking bar mounted on the base with cover 14 tightly biased against locking bar 12e. Continued movement of second locking link 24 and third axis 3 is limited by engagement of surface 24d of second end 24c of locking link 24 with handle link 22 as seen in FIG. 9.

In the locked position described above, the cover is securely maintained in that position, insensitive to vibration, until the second end of first handle link 22 is pivoted away from the cover.

In the embodiment described above, the cover also serves as an integrally formed heat sink to conduct heat away from the semiconductor device being tested in order to prevent excessive heating thereof. In the FIGS. 10–20 modified embodiments, a heat sink member is shown movably mounted on the cover so that the force used in obtaining the required contact force for the many individual contact matings between the contact elements in the contact mounting plate and respective contacts or leads of the semiconductor device can be separated from the force used to provide a thermal coupling between the heat sink and the semiconductor device being tested and can be independently controlled.

Figure 10:
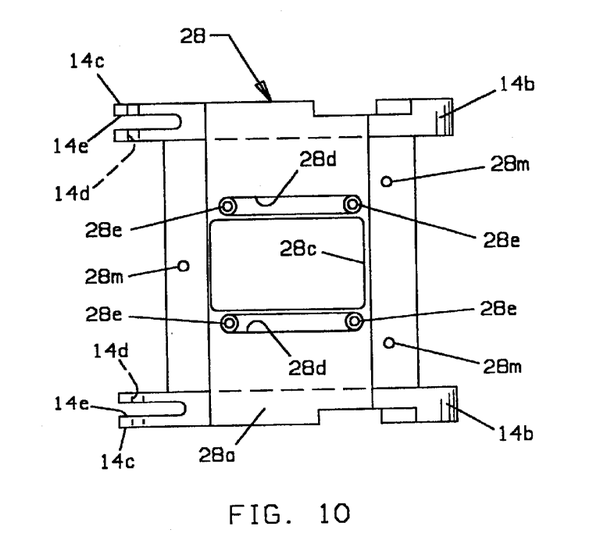
FIG. 10 is a bottom plan view of the cover of another embodiment of the invention.
Figure 10A:
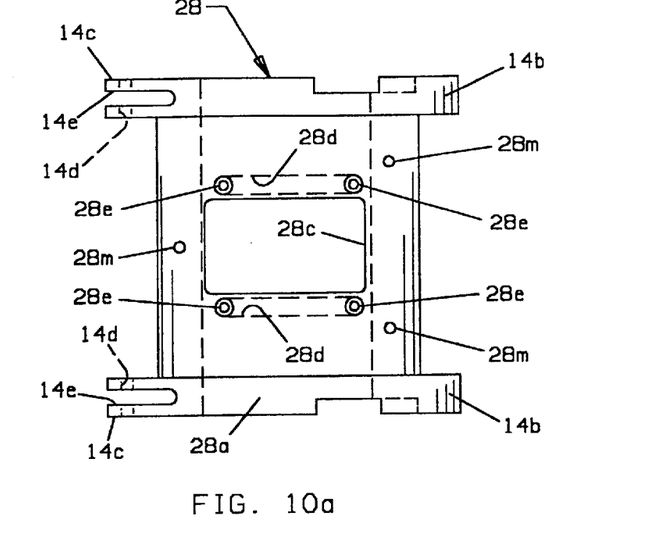
FIG. 10a is a top plan view thereof.
Figure 10B:
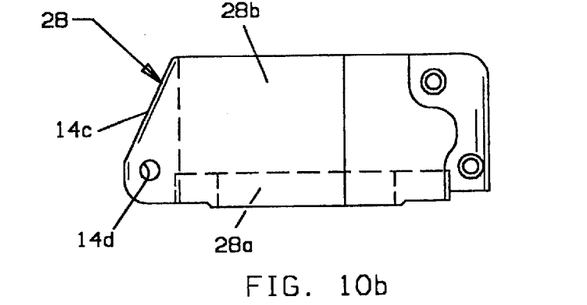
FIG. 10b is a side elevational view thereof and FIG. 10c is a front elevational view, partly in cross section, thereof.
Figure 10C:
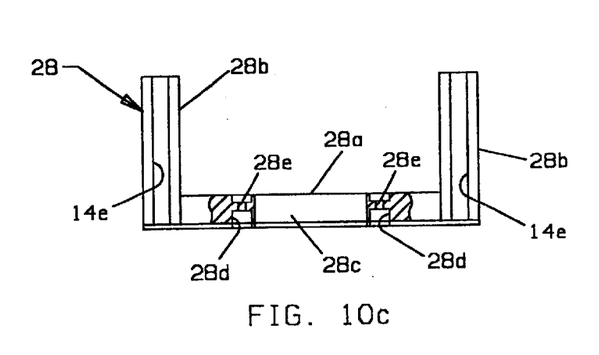

With reference to FIGS. 10–10c, cover 28 comprises a bottom wall 28a and opposed upstanding sidewalls 28b. Hub 14b is formed at one end of each sidewall for mounting of link 22 and, at the opposite end of each sidewall, ears 14c are provided for pivotal mounting to shaft 16, described with reference to FIG. 2. Ears 14c are provided with a laterally extending bore 14d for receipt of shaft 16. Ears 14c are preferably bifurcated at 14e to enhance stability of the mounting of the cover to the base. Springs 16a are conveniently placed about shaft 16 between the bifurcated ears and are used to bias cover 28 (and 14 of the first embodiment) toward the open position. A heat sink receiving aperture 28c is centrally located in bottom wall 28a for slidably receiving therethrough a stepped portion of heat sink 30 to be discussed.

Figure 11:
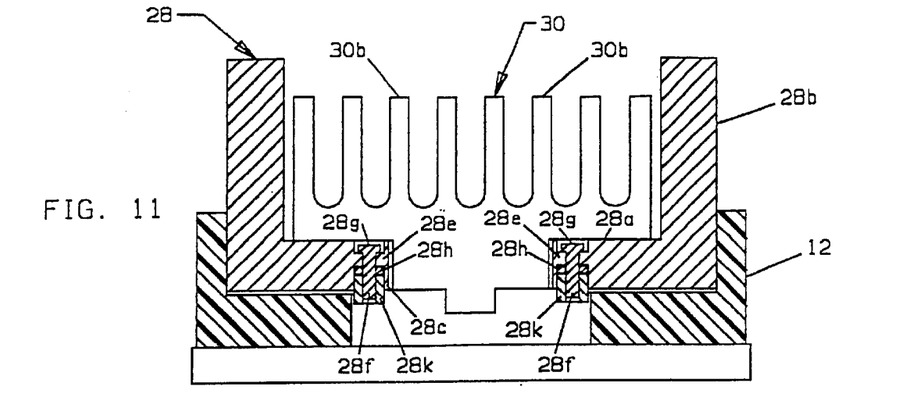
FIG. 11 is a simplified cross sectional view showing the FIG. 10 cover with a separate heat sink and details of pressure bars on either side of the heat sink.

Parallel extending slots 28d are formed in the bottom surface of bottom wall 28a on either side of aperture 28b closely adjacent thereto and extending in a direction generally parallel to sidewalls 28b. As seen in FIGS. 10c and 11, countersunk bores 28e extend through bottom wall 28a at each end of slots 28d. A pin 28f having a head 28g is received in each bore 28e with the head disposed in the countersunk portion recessed from the top surface of wall 28a. Pins 28f are received through a respective hole in flexible strip 28h of suitable material such as silicone rubber having a selected durometer to provide a compressable mount and the end of the pins are fixedly attached to a pressure bar 28k slidably received in each slot 28d, the pressure bars extending beyond the lower surface of bottom wall 28a and being adapted to place a flexible clamping force on the outer margins of a semiconductor device received in the semiconductor device seat of the base. Although two such pressure bars are described, it is within the purview of the invention to use a single pressure bar or more than two pressure bars, if desired. Further, other compressible elements can be employed in place of flexible strip 28h such as a spring element, if desired.

Figure 12:
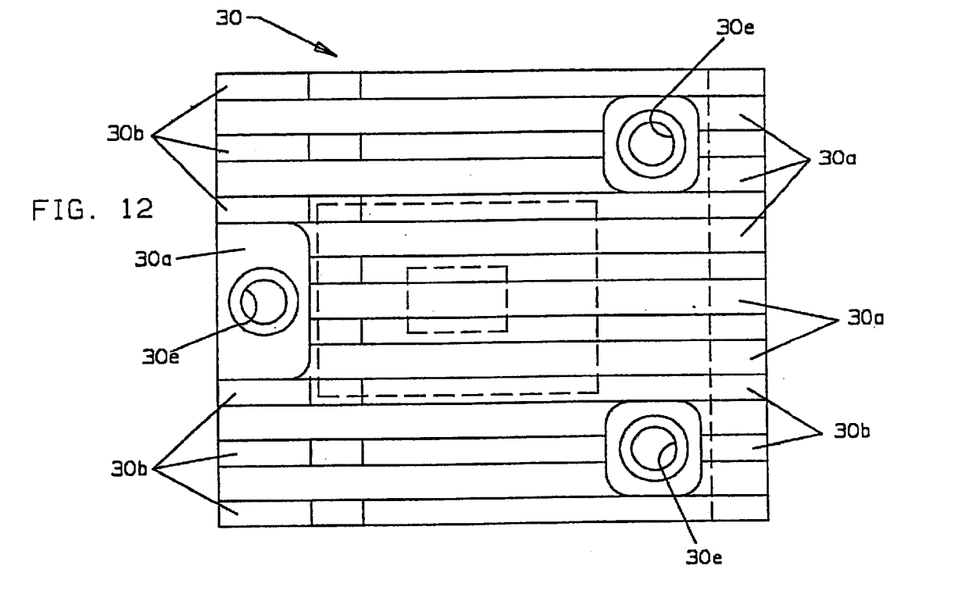
FIG. 12 is a top plan view of the heat sink of FIG. 11
Figure 12A:
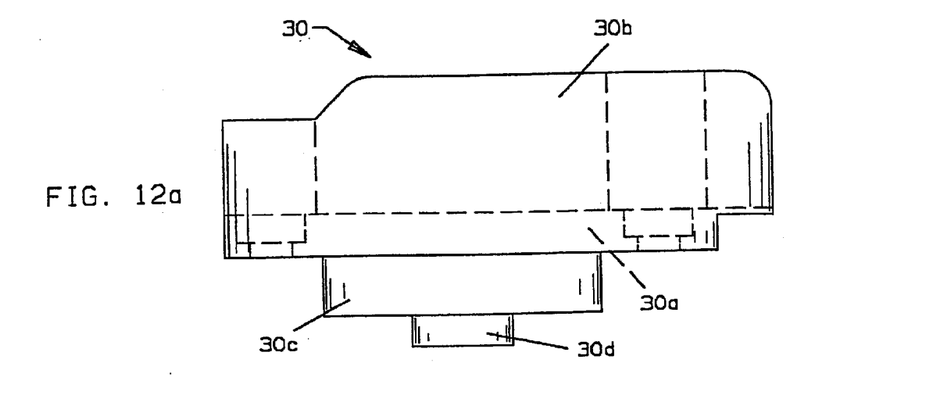
FIG. 12a is a side elevational view thereof.
Figure 13:
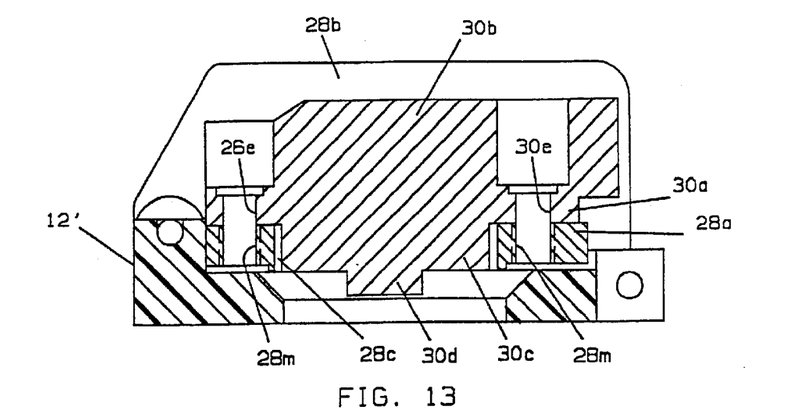
FIG. 13 is a simplified cross sectional view showing details of the mounting arrangement of the FIG. 12 heat sink on the cover.
Figure 14:
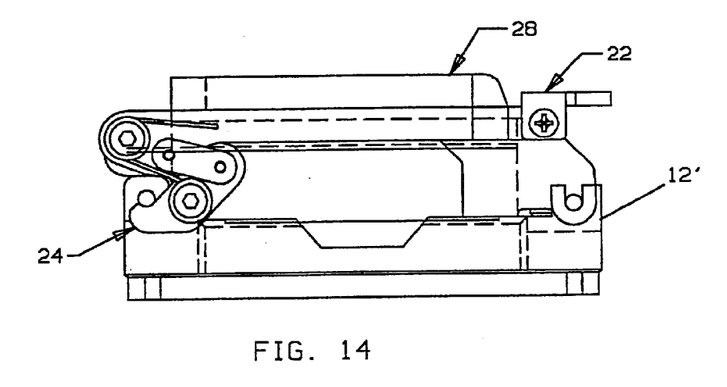
FIG. 14 is a side elevational view of another embodiment of the invention incorporating a modified heat sink movably mounted on the cover of the socket.
Figure 15:
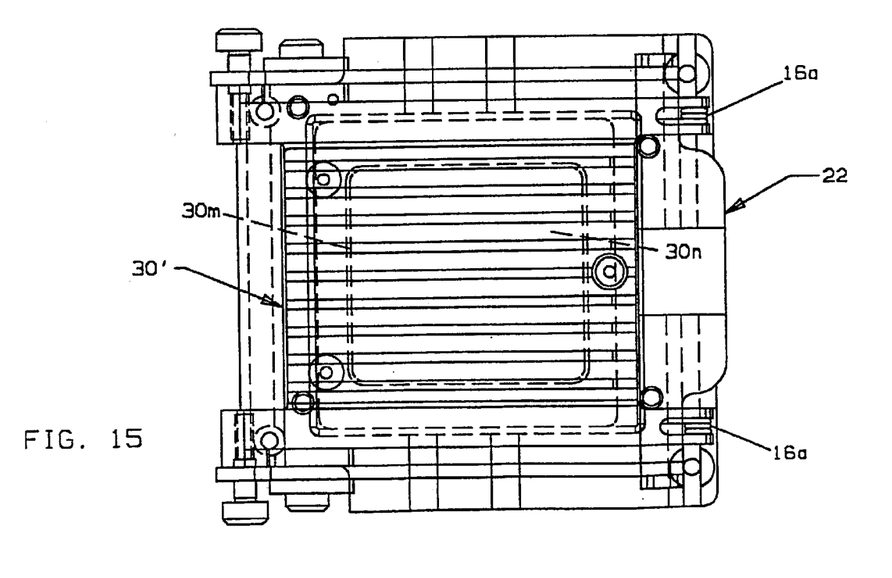
FIG. 15 is a top view of the FIG. 14 socket.
Figure 16:
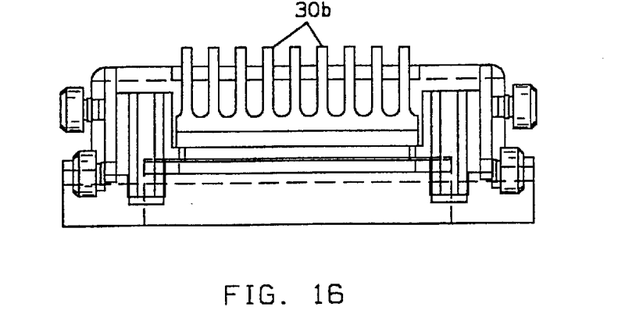
FIGS. 16 is a front elevational view of the FIG. 14 socket.
Figure 18:
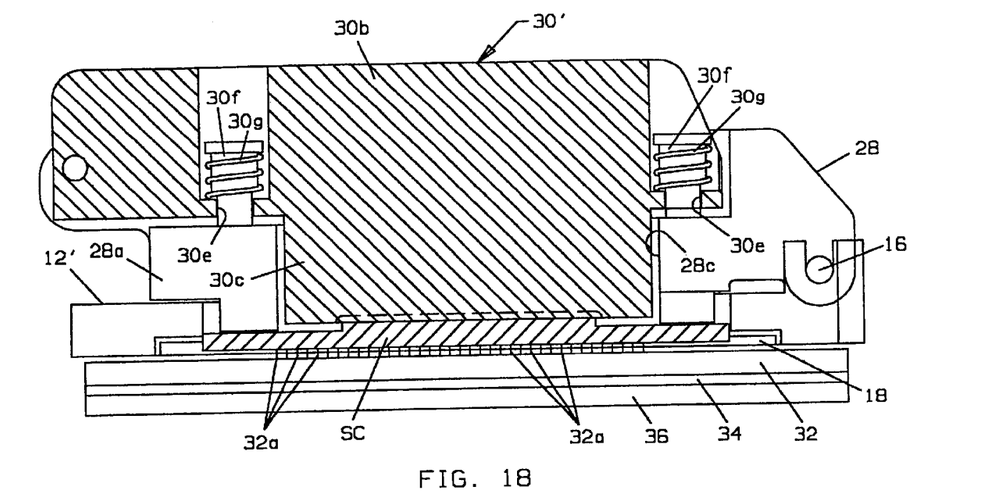
FIG. 18 is a simplified cross sectional view similar to FIG. 13 of the modified heat sink and showing details of the mounting arrangement of both heat sink embodiments on the cover and also showing the socket mounted on a circuit board.

FIGS. 12 and 12a show one type of heat sink adapted for use with cover 28. Heat sink 30 comprises a bottom wall 30a and upstanding spaced-apart heat transfer fins 30b. A stepped portion 30c, complimentary in shape with aperture 28c, extends downwardly from bottom wall 30a and boss portion 30d, complimentary in shape with the die portion of a semiconductor device to be placed in the semiconductor device seat of the base but slightly smaller in length and width, extends further downwardly from stepped portion 30c. Fins 30b are cut back from mounting holes 30e. With reference to FIGS. 12, 13 and 18, heat sink 30 is received on cover 28 with stepped portion 30c received through apertures 28c. Mounting apertures 30e are aligned with threaded bores 28m. A threaded member 30f is received in each mounting aperture and threaded into a respective threaded bore 28m with the head of each threaded member 30f spaced a selected amount from a spring seat on bottom wall 28a and a coil spring 30g is disposed between each head and the head sink. The coil spring is selected to provide the desired force to be applied to the semiconductor device through boss 30d (FIG. 12) or the lower surface of heat sink 30' of FIG. 18, to be discussed. Preferably, and as shown, three mounting bores 30e are used in mounting the heat sink to the cover with two bores 30e being disposed adjacent the end of the cover which swings open and spaced apart, for example, somewhat more than the width of aperture 28c, and the third bore 30e being centrally disposed adjacent to the pivoted mounted end of the cover. In this way, the application of even force to the semiconductor device is ameliorated to provide a suitable heat conductive coupling without exerting excessive force.

Figure 17:
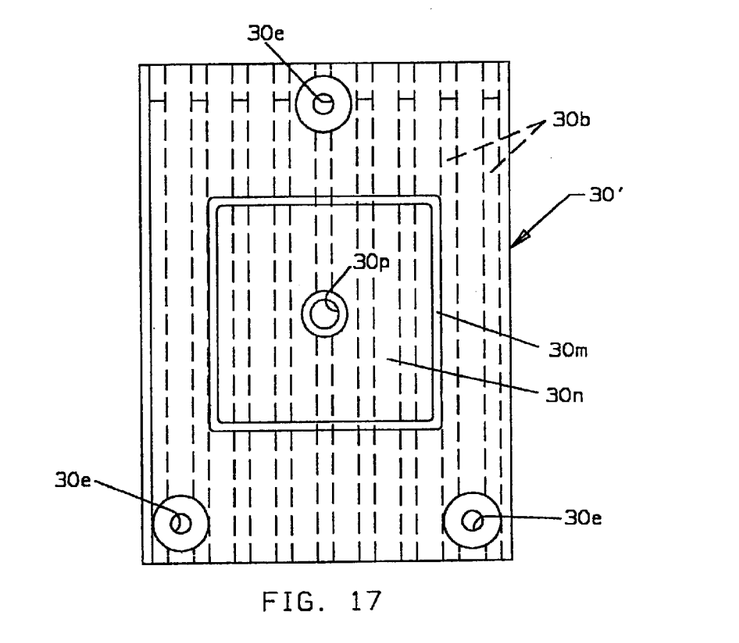
FIG. 17 is a bottom plan view of a modified heat sink for the FIG. 14 socket and FIG. 17a is a front elevational view, partly in cross section, thereof.
Figure 17A:
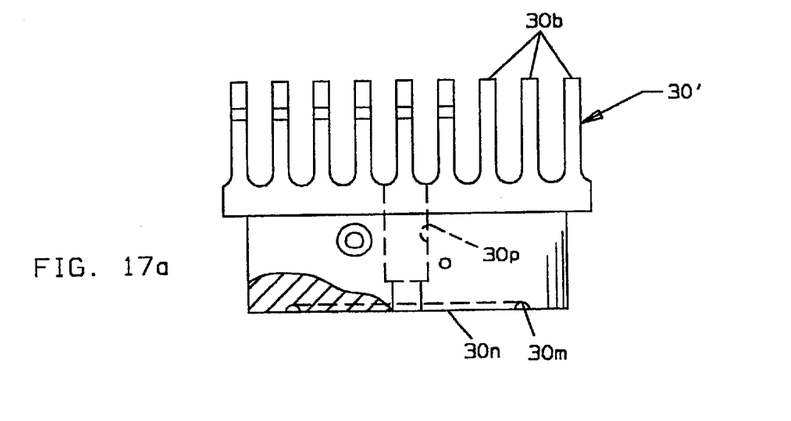

The socket shown in FIGS. 14–18 is shown with a heat sink modified to accommodate certain flip chip, non-encapsulated semiconductor packages when the backside of the die is contacted directly by the heat sink. That is, the inner surface of the heat sink member which engages the semiconductor package is recessed at 30m and provided with a flat central portion 30n to accommodate a selected profile. Also shown in FIGS. 17, 17a is an optional bore 30p to provide access, if desired, for a temperature sensor.

FIG. 18 also shows a socket made in accordance with the invention as it would be used mounted on a circuit board 32 having an array of contacts 32a interconnected to the matching array of contacts of the contact mounting plate. Preferably, a back-up plate 36 and insulator 38 are attached to the socket through the circuit board to maintain rigid support and prevent bowing of the circuit board. Suitable machine screws are received through the base of the socket, the circuit board, insulator and back-up plate with nut to fasten the several components together and provide desired contact force between the socket and circuit board. Typically, a circuit board will have many sockets mounted on the board for placement in an oven and simultaneous testing.

Figure 19:
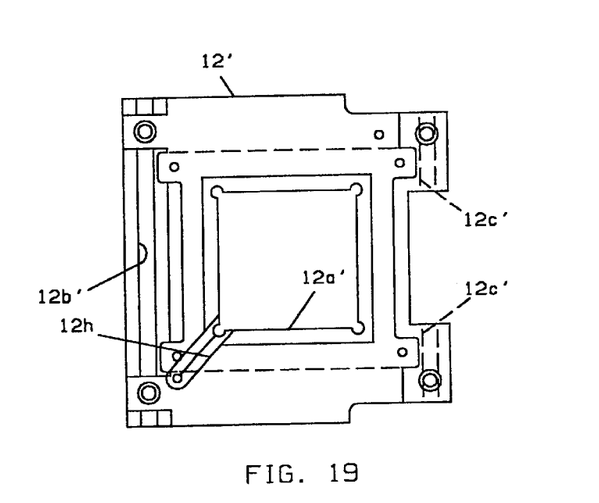
FIG. 19 is a top plan view of the base of another embodiment of the socket shown in FIG. 20
Figure 19A:
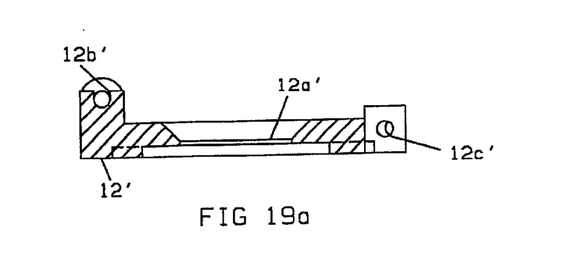
FIG. 19a is a cross sectional view taken through FIG. 19.
Figures 20, 21:
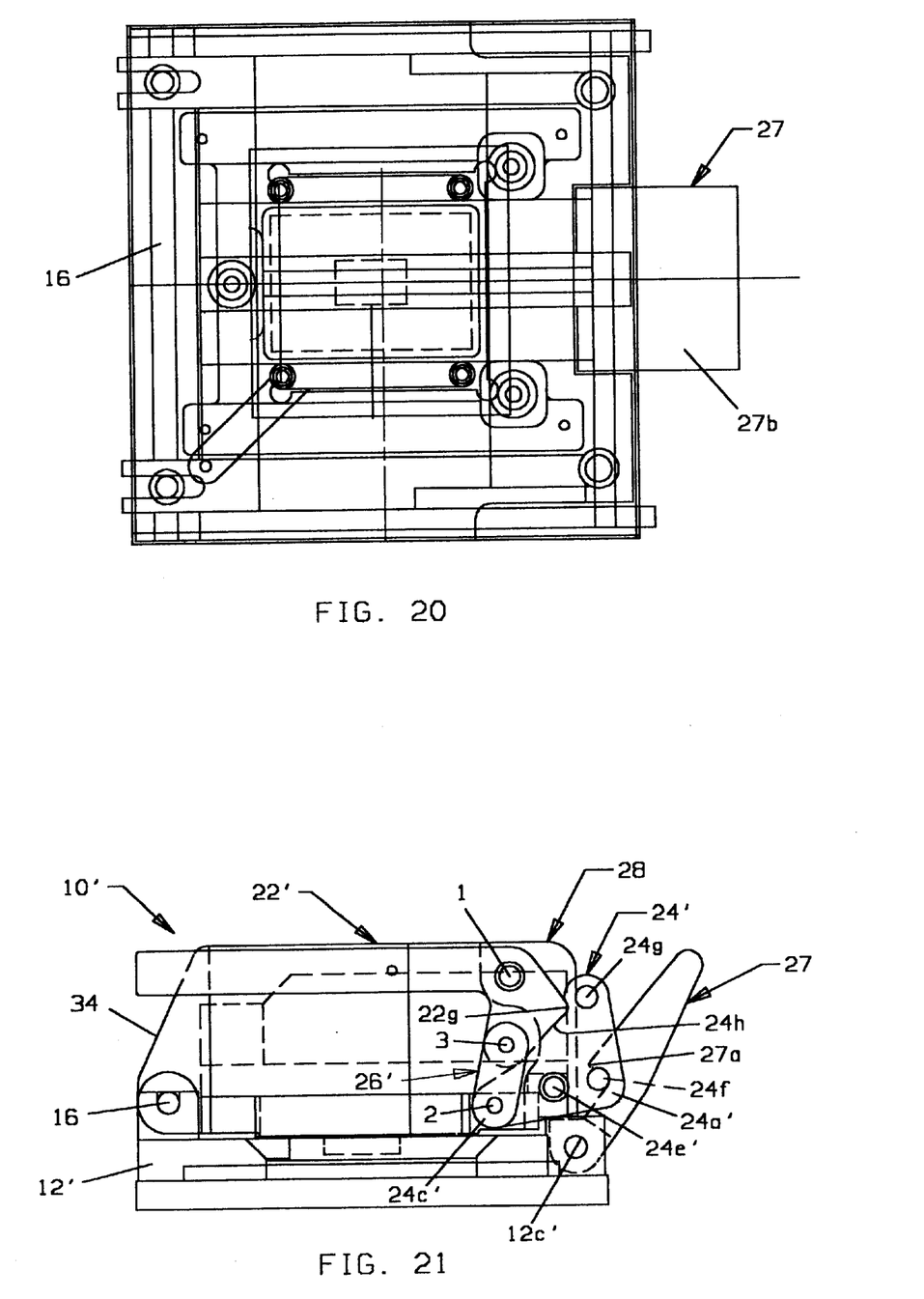
FIGS. 20 and 21 are a top plan view and a side elevational view, respectively, of another embodiment of the invention showing a modified locking mechanism.

With reference to FIGS. 19–23, another embodiment is shown which relates to a locking and linkage mechanism used for either automatic or manual operation. FIGS. 19, 19a show a base 12' formed with a semiconductor device seat 12a' having a slightly different configuration from that shown in FIG. 1. A slot 12b' is formed along one end for receipt of shaft 16 for pivotably connecting the cover and bores 12c' are formed at the opposite end for receipt of a locking member, to be described. Also shown in FIG. 19 is a slot 12h which is open to seat 12a' for placement of a suitable spring member (not shown) for biasing an SC device toward a reference surface, much like springs 12k shown in FIG. 4. As shown in FIG. 21, first link 22'; is pivotably connected to cover 34 as in the FIGS. 1–9 embodiment. Second locking link 24' is rotatably connected to the cover at a location 24e' intermediate first and second ends 24a', 24c'. A second locking member portion in the form of a pin 24f extends laterally between the second links disposed at each side of socket 10'. The second end 24c' is pivotally connected to third interconnecting link 26' as in the FIGS. 1–9 embodiment. Third interconnecting link 26' is pivotably connected at one end to second link 24' and at its other end to first handle link 22'. This provides the same first axis 1 immovable relative to cover 34, second axis 2 movable relative to cover 34 and third axis 3 movable between an unlocked position on one side of an imaginary line running through axes 1 and 2 and a locked position on the other side of the imaginary line.

The first locking member portion in the present embodiment takes the form of a pivotably mounted locking member 27 (see FIGS. 20, 21) centrally disposed at the front end of socket 10' and pivotably mounted at 12c' of base 12' (FIG. 19) and formed with a force receiving release surface 27b and a locking pin catch 27a. In addition to socket locking pin 24f, second locking link 24' is also provided with a system locking and release pin 24g spaced a selected distance from socket locking pin 24f. Second link 24' is also provided with a follower surface 24h which cooperates with a cam surface 22g of first link 22'. In this embodiment, third axis 3 is maintained stable by system locking and release pin 24g tightly biased against cover 34.

Figure 22A:
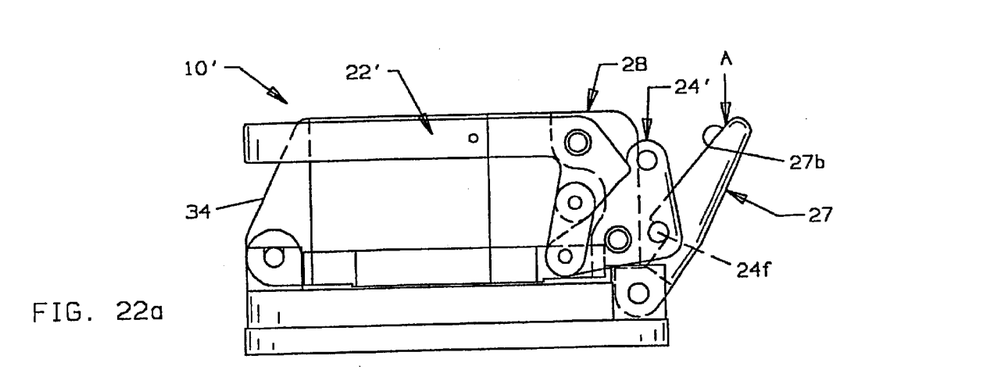
FIGS. 22a–22c show intermediate positions of the FIGS. 20, 21 socket being released (opened) by an automatic mechanism, not shown.
Figure 22B:
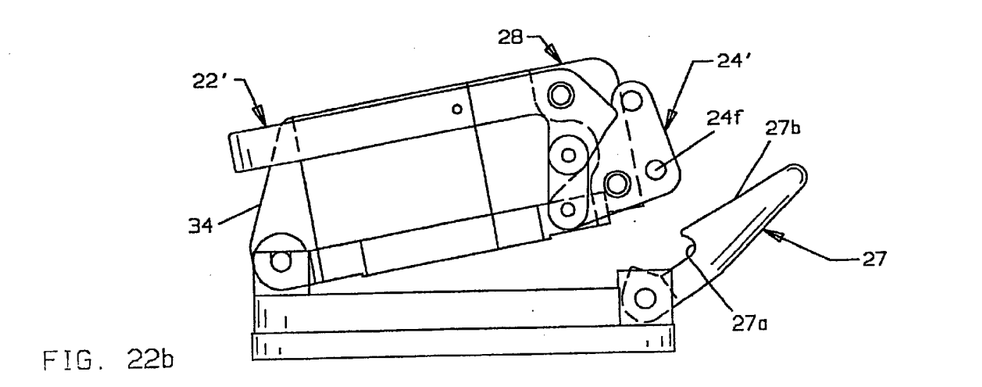
Figure 22C:
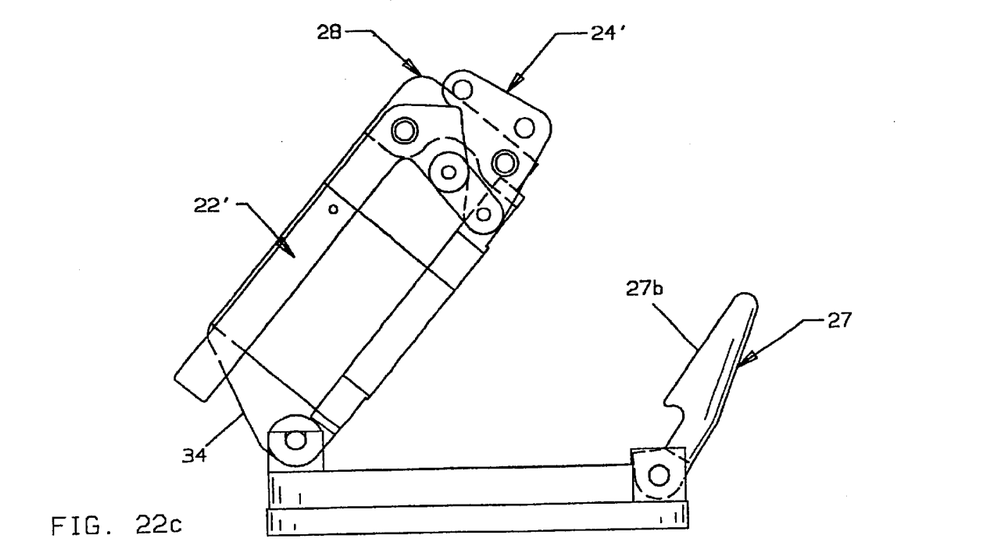

With reference to FIGS. 22a–22c, an automated release is effected by applying a force on release surface 27b by a suitable mechanism, not shown, but indicated by arrow A in FIG. 22a. Locking member 27 is pivoted away from cover 34 thereby moving locking pin catch 27a away from locking pin 24f allowing cover 34 to pivot to the opened position shown in FIG. 22c under the influence of suitable spring members, not shown.

Figure 23A:
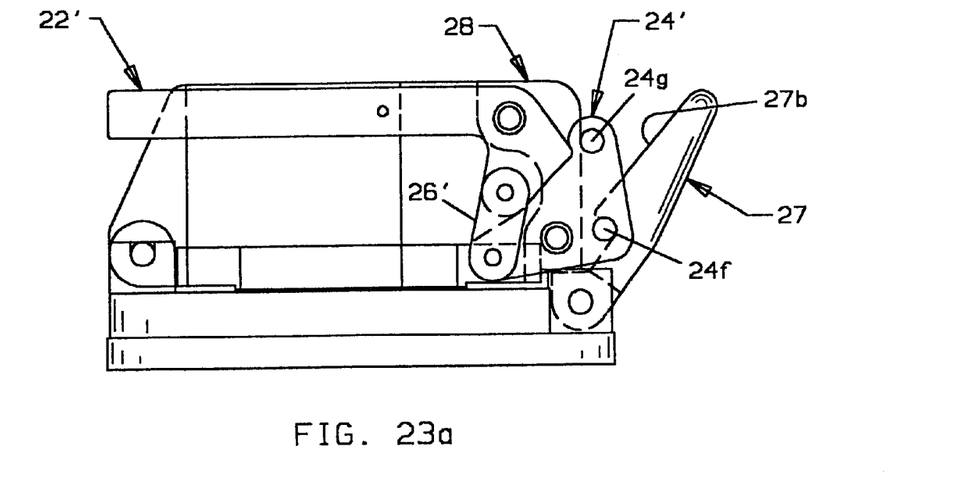
FIGS. 23a–23d show intermediate positions of the FIGS. 20, 21 socket being released (opened) manually.
Figure 23B:
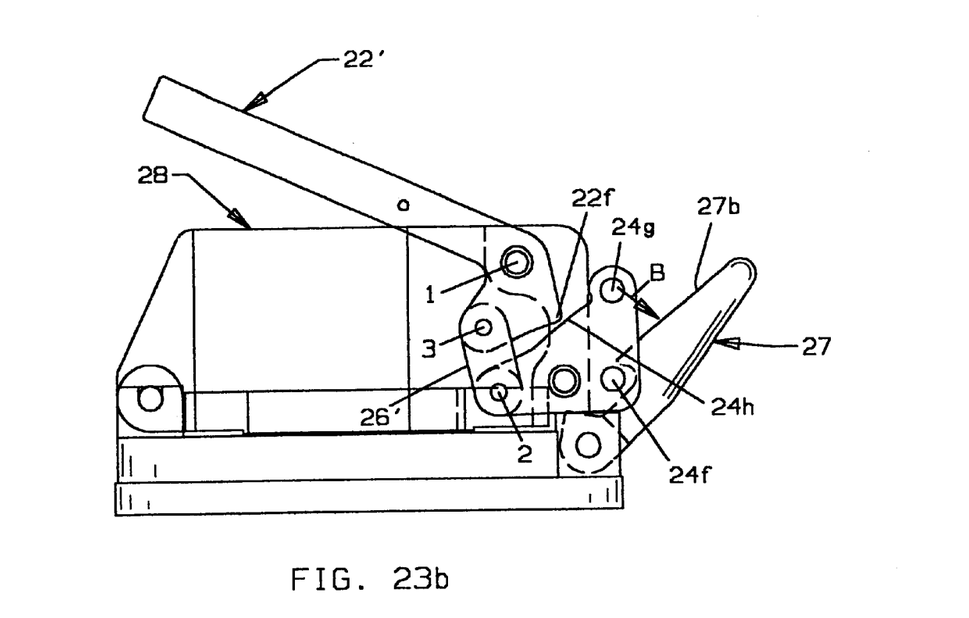
Figure 23C:
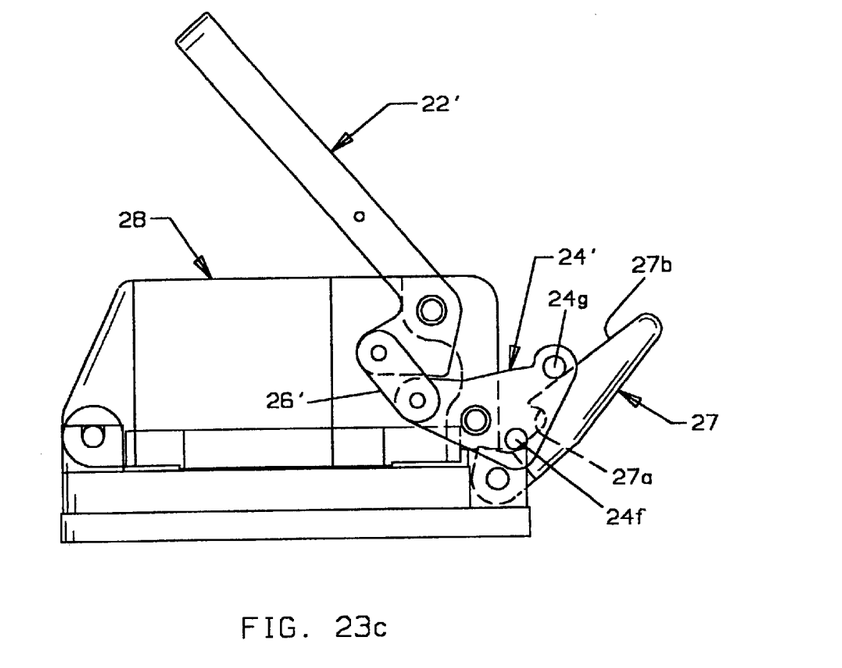
Figure 23D:
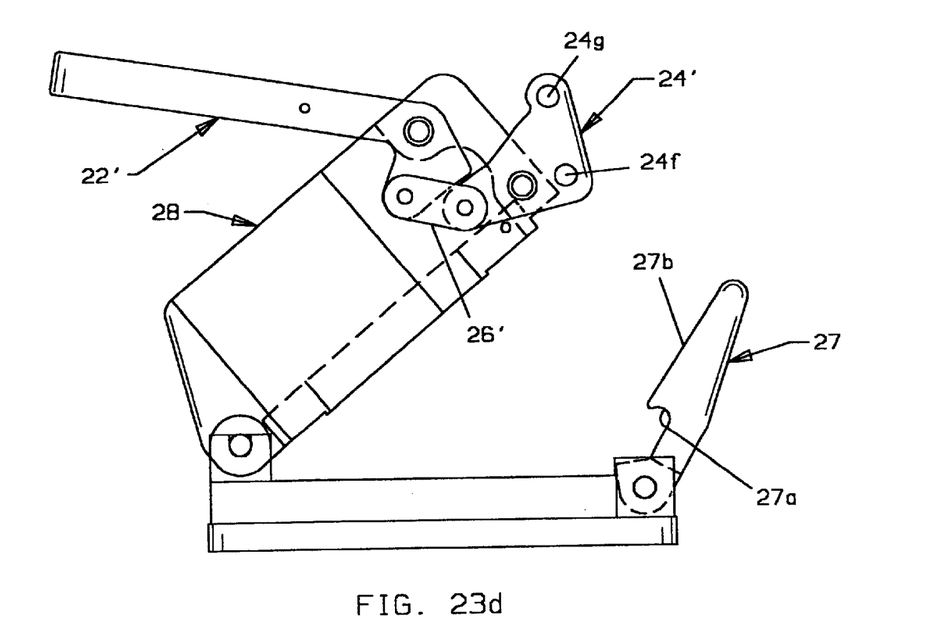

FIGS. 23a–23d show intermediate steps in manually opening of cover 34. FIG. 23a reflects the locked position while FIG. 23b shows first handle link 22' pivoted causing cam surface 22f to rotate second locking link 24' moving axis 3 to the unlocked position and bringing release pin 24g into engagement with release surface 27b of locking member 27 (FIG. 23c) indicated by arrow B in FIG. 23b causing it to pivot moving locking pin catch 27a away from locking pin 24f (FIG. 23c) to allow cover 34 to pivot to the open position shown in FIG. 23d.

In this embodiment, over-center motion of axis 3 (FIG. 21) is limited by engagement of follower surface 24h with first handle link 22' as shown in FIG. 21.

Figure 24:
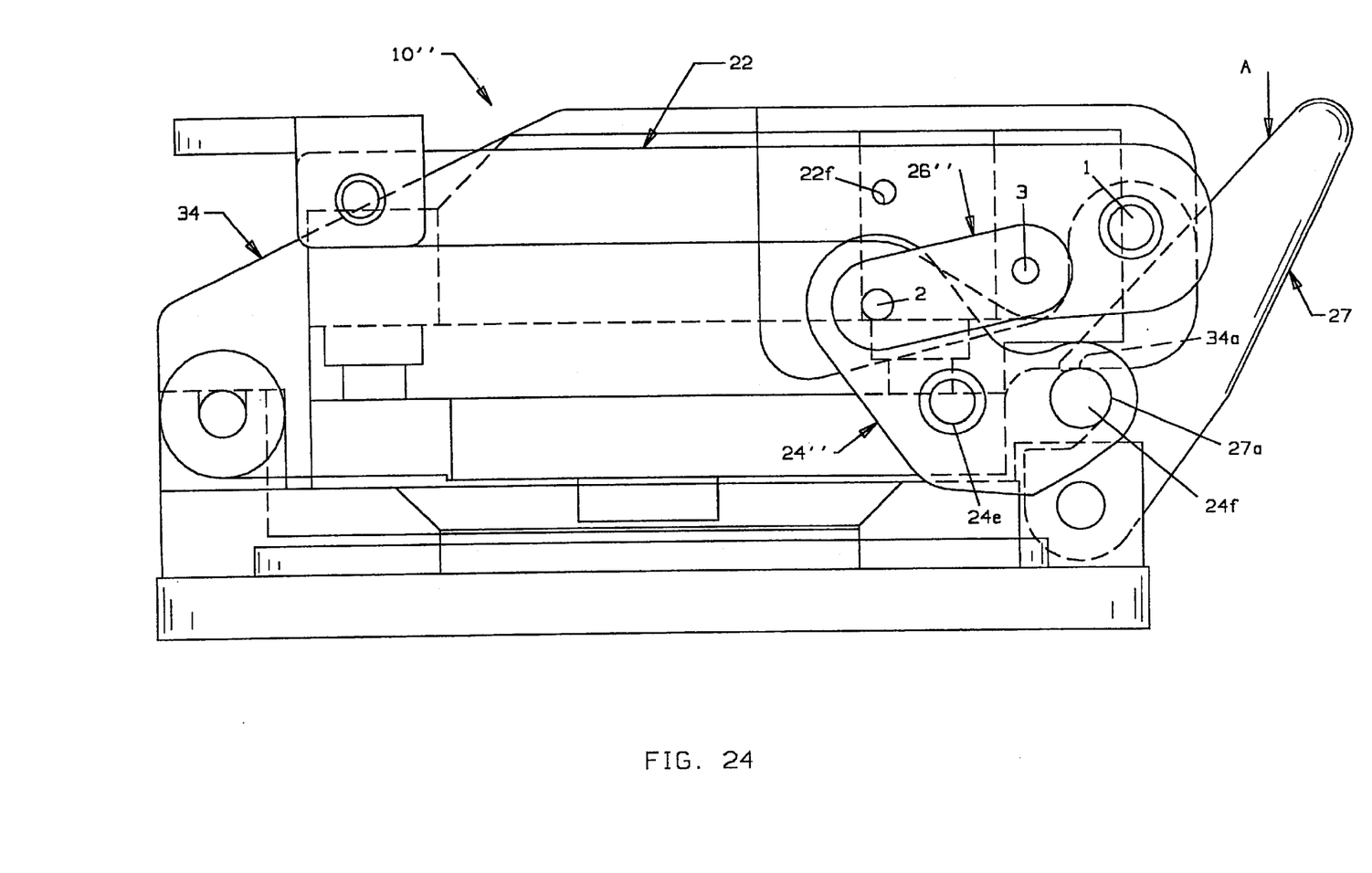
FIG. 24 is a side elevational view of a modification of the FIGS. 20, 21 embodiment.

FIG. 24 shows a modification 10" of the FIGS. 20, 21 embodiment in which the socket locking pin 24f, extending between the respective second or locking links 24" at each side of the socket, serves both to inter-engage with catch 27a to hold the cover in the closed position when the linking mechanism is locked as well as to interact with cover 34 at surface 34a for locking the mechanism. The locking and stabilizing function performed by system locking and release pin 24g biased against cover 34 in the FIGS. 20, 21 embodiment and by surface 14g of cover 14 biased against surface 12g of locking bar 12e of the FIGS. 1–9 embodiment is performed in the FIG. 24 embodiment by pin 24f tightly biased against surface 34a of cover 34.

In the FIG. 24 embodiment, starting at the closed, locked socket position, as the handle link 22 is pivoted away from the cover once axis 3 moves to the opposite side of the imaginary line between axes 1 and 2. Rotation of links 26" and 24" cause pin 24f to move downwardly and inwardly toward the center of the socket resulting in separation of the pin and locking catch 27a for manual release. As in the FIGS. 20, 21 embodiment, a downward force on locking member 27 as indicated by arrow A, will rotate locking member 27 downwardly resulting in separation in the automated mode of operation.

It should be understood that the invention includes all modifications and equivalents of the described embodiments falling within the scope of the appended claims.

What is claimed:

1. A socket for removably receiving an electronic part having a plurality of contacts disposed along a bottom surface thereof comprising:

a contact member mounting plate, a plurality of contact members mounted in the contact mounting plate for providing an electrical interconnection between contacts of the electronic part and a circuit board, a base member having an electronic part seating aperture mounted on the contact member plate, a cover having first and second opposite ends, the first end pivotably mounted on the base member and the cover movable between opened and closed positions and having at least one spring member urging the cover toward the opened position, a locking mechanism having a first locking member extending from the base member, a linkage mechanism having a first link pivotably connected to the cover on a first axis immovable relative to the cover, the first link being pivotable toward and away from the cover between a closed position and an opened position, respectively, a second link rotatably connected to the cover, the second link having a second locking member for inter-engaging the first locking member and an interconnecting link having first and second ends, the first end of the interconnecting link pivotably connected to the second link on a second axis movable relative to the cover and the second end of the interconnecting link pivotably connected to the first link on a third axis movable relative to the cover, the third axis being on one side of an imaginary line extending between the first and second axes when the first link is pivoted away from the cover, the third axis movable to the opposite side of the imaginary line when the first and second locking members are inter-engaged and the first link is moved toward the cover to the closed position.

2. A socket according to claim 1 further comprising a stop surface formed on first link for engagement with the second link to limit the motion of the second link when the first link is in the closed position.

3. A socket according to claim 2 in which the first locking member is a locking pin extending laterally from the base member and the second locking member is a locking pin catch.

4. A socket according to claim 3 in which the second end of the cover is formed with a surface portion that engages the base when in the closed position and the distance between the locking pin catch and the portion of the second end of the cover which engages the base when the cover is in the closed position is less than the distance from the portion of the locking pin which engages the locking pin catch and the base which engages the second end of the cover.

5. A socket according to claim 1 in which the first locking member is a all locking pin catch, pivotably mounted on the base and the second locking member is a locking pin extending from the second link.

6. A socket for removably receiving an electronic part having a plurality of contacts disposed along a bottom surface thereof comprising:

a contact member mounting plate, a plurality of contact members mounted in the contact mounting plate for providing an electrical interconnection between contacts of the electronic part and a circuit board, a base member having an electronic part seating aperture mounted on the contact member mounting plate, a cover having first and second opposite ends, the first end pivotably mounted on the base member and the cover movable between opened and closed positions and having at least one spring member urging the cover toward the opened position, a locking mechanism having a locking pin extending laterally from the base member, a linkage mechanism having a set of links including a first handle link having first and second ends, the first end of the first handle link pivotably mounted to the second end of the cover on a first axis immovable relative to the cover, the second end of the first handle link movable toward and away from the cover, a spring member urging the second end of the handle link away from the cover, a second locking link having first and second ends rotatably mounted to the second end of the cover at a location of the second locking link intermediate to the first and second ends thereof, the first end of the locking link having a locking pin receiving catch for engagement with the locking pin and a third interconnecting link having first and second ends, the first end of the third interconnecting link pivotably connected to the second end of the locking link at a second axis movable relative to the cover and the second end of the third interconnecting link pivotably connected to the first handle link at a third axis movable relative to the cover, the third axis being movable in a position on one side of an imaginary line between the first and second axes when the second end of the first handle link is in a position away from the cover maintaining the catch out of alignment with the locking pin as the cover is pivoted to the closed position moving the catch beyond the locking pin, the catch then being moved into alignment and engagement with the locking pin as the first handle link is moved toward the cover, the third axis being moved to a position on the opposite side of the imaginary line when the second end of the first handle link comes to a position against the cover.

7. A socket according to claim 6 in which motion of the second locking link is limited by engagement with the first handle link.

8. A socket according to claim 6 in which the second end of the cover is formed with a surface portion that engages the base when in the closed position and the distance between the locking pin catch and the portion of the second end of the cover which engages the base when the cover is in the closed position is less than the distance from the portion of the locking pin which engages the locking pin catch and the base which engages the second end of the cover.

9. A socket according to claim 6 in which a locking pin extends laterally from opposite sides of the base member, the linkage mechanism further comprising a second set of links including a first handle link, a second locking link and a third interconnecting link as called for in claim 3, the two sets of links arranged at opposite sides of the socket and a handle cross piece is connected to the second end of each first handle link.

10. A socket for removably receiving an electronic part having a plurality of contacts comprising:

a contact member mounting plate, a plurality of contact members mounted in the contact mounting plate for providing an electrical interconnection between contacts of the electronic part and a circuit board, a base member having an electronic part seat mounted on the contact member mounting plate, a cover having first and second opposite ends, the first end pivotably mounted on the base member, the cover being movable between opened and closed positions and having a spring member urging the cover toward the opened position, a locking mechanism having a first portion of a lockage mechanism mounted on the base and having a linkage mechanism, the linkage mechanism comprising, a first link pivotably mounted on the cover on a first axis immovable relative to the cover, the first link having a first end pivotable toward and away from the cover between a closed position and an opened position, respectively, a second link having first and second ends rotatably connected to the cover intermediate to the first and second ends, the second link having a second portion of a locking member located on the first end thereof, a third interconnecting link having first and second ends, the first end of the third link pivotably connected to the second end of the second link on a second axis movable relative to the cover and the second end of the third link pivotably connected to the first link on a third axis movable relative to the cover, the third axis being on one side of an imaginary line extending between the first and second axes when the first end of the first link is pivoted away from the cover, the third axis movable to the opposite side of the imaginary line when the first portion of the locking member is engaged by the second portion of the locking member and the first end of the first link is moved toward the cover to the closed position.

11. A socket according to claim 10 in which the first portion of the locking member is pivotably mounted on the base.

12. A socket according to claim 10 in which the second link is formed with an extension which engages the first portion of the locking member when the first link is pivoted to the open position causing the first portion of the locking member to pivot.

13. A socket according to claim 11 in which the pivotably mounted first portion of the locking member has a force receiving distal end portion and a locking pin catch is formed on the first portion of the locking member, and the second portion of the locking member comprises a pin extending laterally from the second link for engagement with the locking pin catch.

* * * * *